United States Patent [19]

Lafferty et al.

[11] 4,450,590
[45] May 22, 1984

[54] DISCRIMINATOR CIRCUIT FOR FREQUENCY MODULATION RECEIVERS

[75] Inventors: Edwin C. Lafferty; James H. Gibson, both of Lynchburg, Va.

[73] Assignee: General Electric Company, Lynchburg, Va.

[21] Appl. No.: 47,689

[22] Filed: Jun. 12, 1979

[51] Int. Cl.³ .......................... H03D 3/02; H03K 9/06
[52] U.S. Cl. .................................... 455/214; 455/337; 329/134; 329/137; 307/513
[58] Field of Search ................ 325/349, 350; 329/109, 329/118, 131, 132, 134, 137, 140, 145; 455/214, 215, 216, 337, 338, 205, 263; 307/513, 262

[56] References Cited

U.S. PATENT DOCUMENTS

| | | | |
|---|---|---|---|
| 2,835,803 | 5/1958 | Bose | 455/337 |
| 3,519,944 | 7/1970 | Avins | 329/137 |
| 3,701,030 | 10/1972 | Gocho et al. | 329/134 |
| 4,053,842 | 10/1977 | Turski et al. | 329/134 |
| 4,091,330 | 5/1978 | Hidaka | 455/214 |

Primary Examiner—Tommy P. Chin
Attorney, Agent, or Firm—James J. Williams

[57] ABSTRACT

A frequency modulation receiver uses a low intermediate frequency (IF) signal for good image frequency rejection. The intermediate frequency signal is discriminated (or demodulated) after amplitude limiting the intermediate frequency signal by doubling the limited signal and providing pulses whose average value represents the modulating information. The pulses are applied to a low pass filter which rejects the doubled frequency signal relatively easily.

5 Claims, 4 Drawing Figures

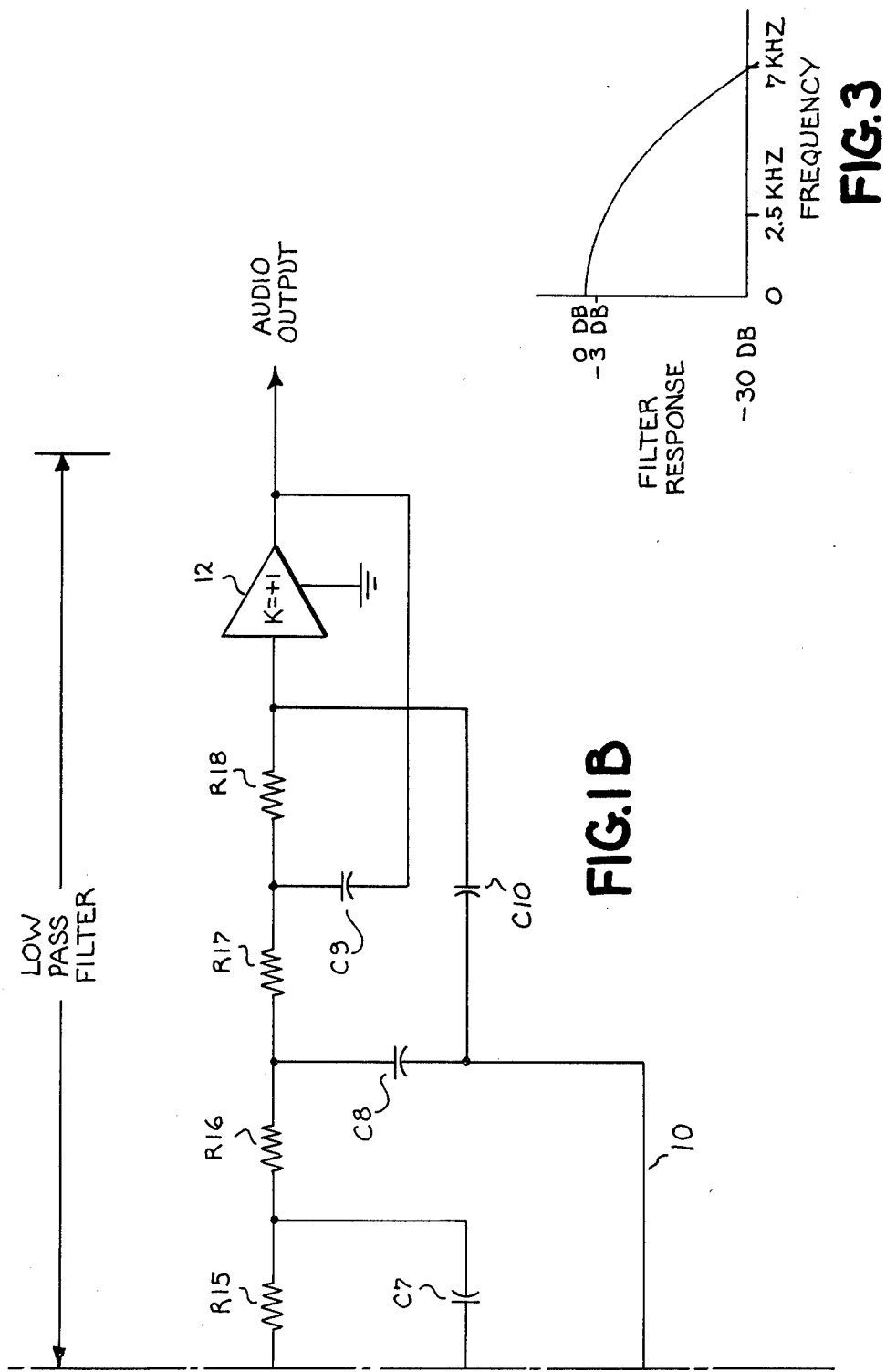

DISCRIMINATOR CIRCUIT FOR FREQUENCY MODULATION RECEIVERS

BACKGROUND OF THE INVENTION

Our invention relates to a discriminator circuit for frequency modulation (FM) receivers, and particularly to such a discriminator for use with a relative low intermediate frequency.

In a superheterodyne type of radio receiver, rejection of undesirable image radio frequencies requires the use of radio frequency selectivity. For example, if a carrier frequency of 150.030 Megahertz is to be received by a receiver whose first intermediate frequency (IF) is 10.0 Megahertz, the receiver local oscillator might be set at 140.030 Megahertz. However, a received carrier frequency of 130.030 Megahertz (called the image frequency) would also produce the first IF of 10.0 Megahertz. Hence, a selective circuit that rejects the image frequency is very desirable, and in some cases essential.

Accordingly, a primary object of our invention is to provide a new and improved circuit for a superheterodyne radio receiver that rejects many image frequencies.

Another object of our invention is to provide a new and improved circuit for a superheterodyne radio receiver that rejects many image frequencies without the need, and hence expense, of a selective circuit to reject those image frequencies.

One prior art superheterodyne receiver for reducing the image frequency problem uses a single converter and a low intermediate frequency (IF), such as 7 Kilohertz. In the above example, where the received carrier is 150.030 Megahertz, the receiver local oscillator might be set at 150.030 Megahertz minus 7 Kilohertz, or 150.023 Megahertz. If the channel spacing at those carrier frequencies is 30 Kilohertz, there should not be any signals at the image frequency of 150.023 Megahertz minus 7 Kilohertz or 150.016 Megahertz, since the next lower carrier would be 150.000 Megahertz. Hence, the image frequency problem is substantially reduced or eliminated. However, the low IF of 7 Kilohertz makes it difficult to detect intelligence present on the IF, particularly if the intelligence has any appreciable bandwidth. Voice transmissions require a 3 Kilohertz bandwidth for reliable communication under normal conditions. This requirement and an IF of 7 Kilohertz results in a low IF to intelligence bandwidth ratio of 2.3 to 1. Such a low ratio makes detection difficult since the 7 Kilohertz IF must be rejected, and the 3 Kilohertz intelligence must be passed in order to be detected.

Accordingly, another object of our invention is to provide a new and improved FM discriminator for use with relatively low intermediate frequency to intelligence bandwidth ratios.

Another object of our invention is to provide an improved FM discriminator that does not require complex circuits or filters to detect intelligence from an IF with a relatively low IF to intelligence bandwidth ratio.

Another object of our invention is to provide a new and improved FM discriminator that can operate with relatively low voltage and current.

SUMMARY OF THE INVENTION

Briefly, these and other objects are achieved in accordance with our invention by a frequency modulation (FM) discriminator which is supplied with FM signals that have been converted to relatively low intermediate frequency (IF) signals and amplitude limited. The limited signals are applied to a phase splitter which produces two outputs 180 degrees apart. The two outputs are applied to a frequency doubling pulse generator which produces pulses whose average direct current value varies with the frequency of the amplitude limited signals. These pulses are applied to a low pass filter which passes the varying direct current representing intelligence, and rejects the doubled frequency pulses more readily.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

FIGS. 1A and 1B show a schematic diagram of a preferred embodiment of a discriminator in accordance with our invention; and FIGS. 2 and 3 show wave forms for illustrating the opertion of our discriminator.

DESCRIPTION OF THE PREFERRED EMBODIMENT

Figure 1A:
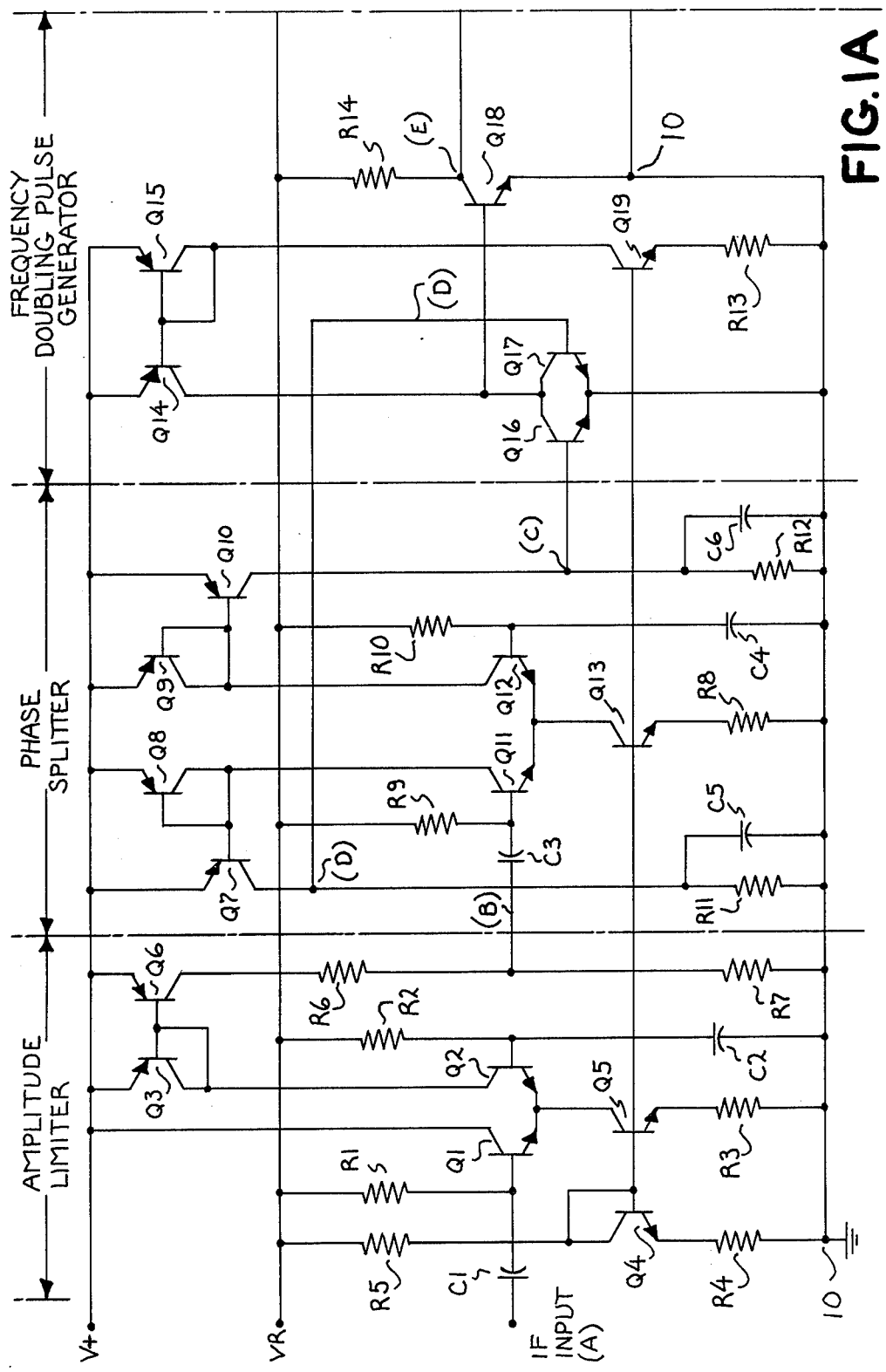

FIGS. 1A and 1B are to be considered together, with the right hand lines of FIG. 1A being connected to the left hand lines of FIG. 1B. Generally, our discriminator as shown in these figures includes an amplitude limiter, a phase splitter, a frequency doubling pulse generator, and a low pass filter, each of these circuits occupying the portion indicated by the dashed and dotted lines. In FIGS. 1A and 1B, capital letters indicate voltages or signals at selected locations in our discriminator; and in FIG. 2, the capital letters indicate the corresponding wave forms for those voltages or signals.

Our discriminator is primarily designed for a frequency modulation (FM) type of radio receiver which does not include a radio frequency selectivity and amplifier circuit. However, our discriminator can be used with FM receivers which do include radio frequency amplifier and selectivity circuits. In either type of receiver, incoming radio frequency signals are heterodyned or mixed with a local oscillator to produce an intermediate frequency (IF) signal. Depending upon the type of circuit preferred, the conversion to the final IF frequency may be a single conversion or a multiple conversion. After such conversion, these signals are applied to the IF input A in the amplitude limiter portion of our discriminator shown in FIG. 1A. Our discriminator uses suitable direct current voltages V+ and VR which are positive with respect to a point of reference potential or ground 10. In one of our embodiments, the voltage V+ had a nominal voltage of 1.1 to 1.5 volts, and the voltage VR was a regulated voltage of 0.9 volt. The input intermediate frequency (IF) signals are coupled through a capacitor C1 to the base of a transistor Q1 connected to a transistor Q2 in a differential amplifier arrangement. The bases of the transistors Q1, Q2 are connected through respective and equal magnitude resistors R1, R2 to the regulated voltage VR. The base of the transistor Q2 is grounded for alternating current by a capacitor C2. The emitters of the transistors Q1, Q2 are connected to the collector of a current source transistor Q5. The emitter of the transistor Q5 is connected through a resistor R3 to the ground 10, and the base of the transistor Q5 is connected to the collector of a control diode Q4 (formed by a transistor). The emitter of the diode Q4 is connected through a resistor R4 to the ground 10, and the collector of the diode Q4 is connected to the regulated voltage VR through a resistor R5. The collector of the transistor Q1 is connected to the voltage V+, and the collector of the transistor Q2 is connected through a diode Q3 (formed by a transistor) to the voltage V+. The collector of the transistor Q2 is also connected to the base of an output transistor Q6 whose emitter is connected to the voltage V+, and whose collector is connected through a series of resistors R6, R7 to the ground 10. The output of the limiter is derived at the junction of the resistors R6, R7 and is designated by the letter B.

Our phase splitter converts the single ended input designated B into two complementary outputs designated C and D which are equal in magnitude and 180 degrees out of phase with each other. Such a circuit is sometimes referred to as a phase inverter. While the output D is substantially in phase with the input B, and the output D is substantially 180 degress out of phase with the input B, their phase relations with the input B are not critical as long as their phase relation or difference is complementary or 180 degrees. The input B is applied through a capacitor C3 to the base of a transistor Q11 connected in a differential amplifier arrangement with a transistor Q12. The emitters of these transistors Q11, Q12 are connected together and connected through a current source transistor Q13 and a resistor R8 to the ground 10. The base of the transistor Q13 is connected to the control diode Q4. The bases of the transistors Q11, Q12 are connected through respective resistors R9, R10 to the regulated voltage VR, and the base of the transistor Q12 is connected through a capacitor C4 to the ground 10. The collectors of the transistors Q11, Q12 are connected through control diodes Q8, Q9 (formed by transistors) to the voltage V+. The collectors are also connected respectively to the bases of current source transistors Q7, Q10. The emitters of these transistors Q7, Q10 are connected to the voltage V+. The collector of the transistor Q7 is connected for charging a capacitor C5, with a resistor R11 connected in parallel for discharging the capacitor C5; and the collector of the transistor Q10 is connected for charging a capacitor C6, with a resistor R12 connected in parallel for discharging the capacitor C6. The outputs of the phase splitter are designated C and D, and are derived from the collectors of the transistors Q10, Q7 respectively. These outputs are applied to our frequency doubling pulse generator.

The inputs C and D to the frequency doubling pulse generator are respectively applied to the bases of transistors Q16, Q17 connected as a switch. The emitters of the transistors Q16, Q17 are connected together and connected to the ground 10. The collectors of the transistors Q16, Q17 are connected together, and are connected through a current source transistor Q14 to the voltage V+. The base of the transistor Q14 is connected to a control diode Q15 (formed from a transistor). The base of the transistor Q14 is also connected through a current source transistor Q19 and resistor R13 to the ground 10. The base of the transistor Q19 is also connected to the control diode Q4. The collectors of the transistors Q16, Q17 are connected to an output transistor Q18. The emitter of this output transistor Q18 is connected to the ground 10, and the collector is connected through a resistor R14 to the regulated voltage VR. The output of the frequency doubling pulse generator is designated as E, and is derived from the collector of the transistor Q18. This output is applied to our low pass filter.

Our low pass filter includes a unity gain amplifier 12 which carries the designation K=+1, which means that the output is in phase with the input, and that the gain is approximately one or unity. Our filter includes a series of resistors R15, R16, R17, R18 connected between the regulated voltage VR and the amplifier 12. The resistor R15 provides bias voltage for the amplifier 12. The resistors R16, R17, R18 along with capacitors C8, C9, C10 when connected as shown with the unity gain amplifier 12 form an active low pass filter. Output signals E from the frequency doubling pulse generator are applied through a capacitor C7 to the filter. The response of the filter of FIG. 1B is shown in FIG. 3. This response falls from 0 at 0 frequency to −3 DB at 2.5 Kilohertz, and falls rapidly at higher frequencies to −30 DB at 7 Kilohertz, and much lower at 14 Kilohertz. This response is relatively easy to obtain, so that the doubled intermediate frequency can be easily eliminated.

Figure 2:
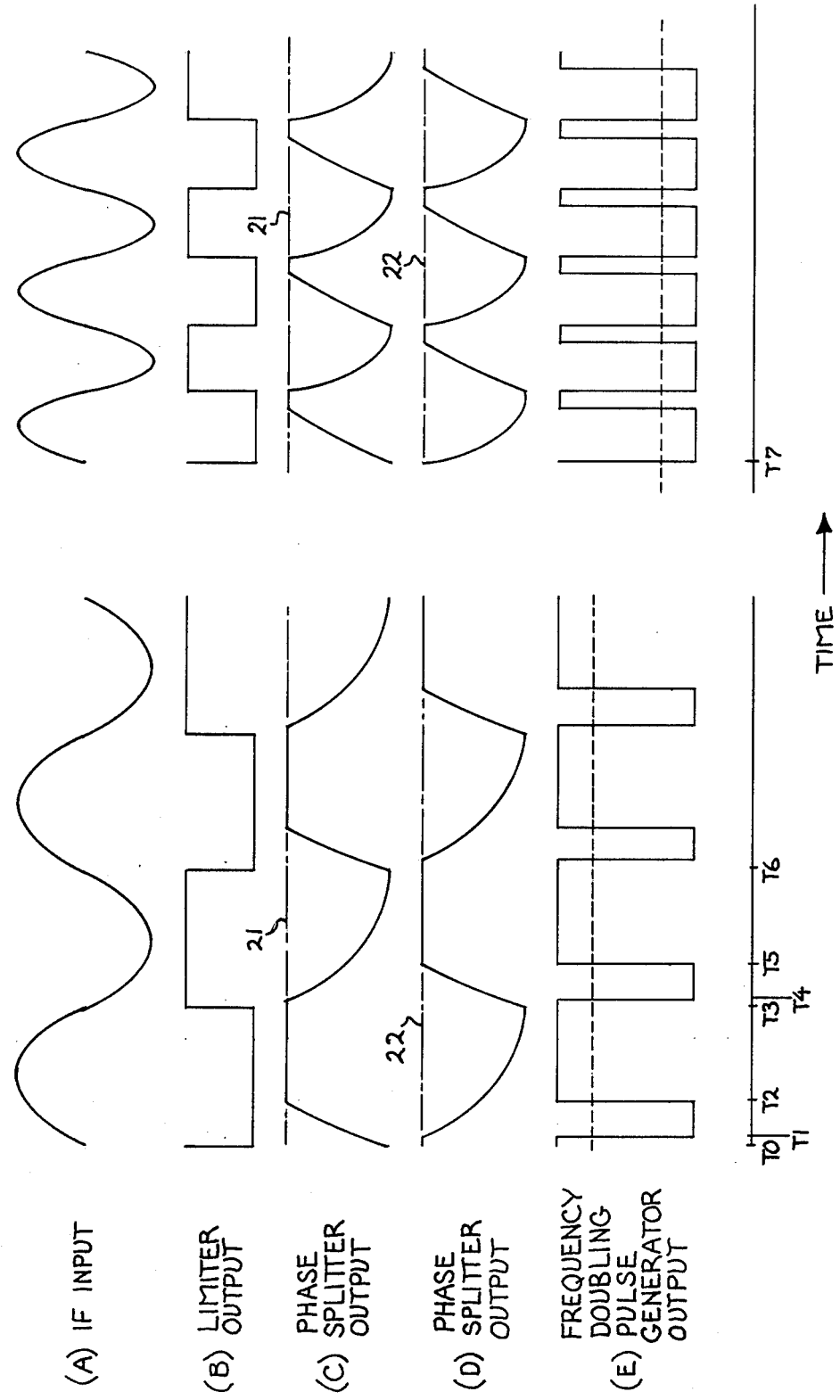

The operation of our FM discriminator is explained in connection with the wave forms of FIG. 2, which are plotted along a common time axis. For frequency modulation with an input IF of 7 Kilohertz, the IF changes from 7 Kilohertz for no modulation to an IF that varies at a rate dependent upon the instantaneous modulation frequency. On the time axis, of FIG. 2, there is a left hand set of wave forms representing a relatively low input frequency, and a right hand set of wave forms representing a relatively high input frequency. Along the vertical axis, we show five wave forms designated A, B, C, D and E, which represent the voltages or signals at the correspondingly designated locations in the circuit of FIGS. 1A and 1B. With respect to the left hand set of wave forms, the IF input A begins to increase at the time T0. Since the output B of the limiter is reversed in phase, its output begins to decrease at the time T0. This decreasing output B causes the transistor Q11 to stop conducting, so that the transistor Q7 stops conducting. With no current supplied by the transistor Q7, the capacitor C5 begins to discharge through the resistor R11. At the same time T0, since the transistor Q11 stops conducting, the transistor Q12 starts conducting. This causes the transistor Q10 to conduct, with the result that the capacitor C6 begins to charge as indicated in the wave form C at the time T0. The outputs C and D are applied to the switching transistors Q16, Q17 in the frequency doubling pulse generator. If either output C or D reaches a respective threshold level 21 or 22, one of the transistors Q16, Q17 conducts. If both outputs C and D are below their respective threshold levels 21, 22, both transistors Q16, Q17 are turned off. At the time T1, the output C is below its corresponding threshold 21, so that the transistor Q16 is turned off. At the time T1, the capacitor C5 has discharged so that the output D falls below its threshold level 22 which causes the transistor Q17 in the frequency doubling pulse generator to be turned off. When the transistor Q17 is turned off, both collectors of the transistors Q16, Q17 rise to a relatively high voltage. Current from the transistor Q14 then turns the transistor Q18 on, and causes the output E of the frequency doubling pulse generator to drop as illustrated in wave form E at the time T1.

The transistor Q18 remains on until the conducting transistor Q10 provides sufficient charge to the capacitor C6 to cause the output C to rise to the threshold 21 at the time T2. When this occurs, the transistor Q16 is turned on which turns the transistor Q18 off. Hence, at the time T2, the frequency doubling pulse generator output rises to its upper value.

The output C remains at the threshold 21, and the output D continues to discharge until the time T3 when the input reverses phase. When this occurs, the transistor Q10 is turned off so that the capacitor C6 begins to discharge through the resistor R12. At the same time, the transistor Q7 is turned on, so that the capacitor C5 begins to charge and the output D begins to increase. At the time T4, when the capacitor C6 discharges below the threshold 21, the output C turns the transistor Q16 off. The transistor Q17 had been off since the time T1. With both transistors Q16, Q17 off, the transistor Q18 is turned on, and the output E falls. This condition remains until the time T5 when the capacitor C5 charges enough so that the output D reaches its threshold 22. At this time T5, the transistor Q17 is turned on to cause the transistor Q18 to be turned off so that the output E rises to its upper value again. The circuit remains in this condition with the output C decreasing, and the output D remaining at its threshold 22 until the time T6 when the input reverses phase again. At this time, the same condition exists which existed at the time T0, so that the cycle just described repeats itself.

Thus with respect to the left hand set of wave forms, for one cycle of the input A between the times T0 and T6, the frequency doubling pulse generator output goes through two cycles and produces two pulses (from T2 to T4 and from T5 to T6). This doubled frequency has an average DC value indicated by the dashed line in the frequency doubling pulse generator output E. This average DC value changes linearly with the rate of change of the intermediate frequency (and the modulation frequency) so that a linearly varying audio signal exists at output E along with the doubling pulse generator pulses. This composite signal is applied to the low pass filter whose response is preferably similar to the response shown in FIG. 3. With a filter response such as shown in FIG. 3, it will be seen that the doubled intermediate frequency of 14 Kilohertz (as well as 7 Kilohertz if present) is effectively rejected, thus improving the signal to noise ratio. After filtering, the audio signals may be applied to any utilization device such as a loudspeaker or tone decoder.

The right hand set of wave forms illustrates the operation of our circuit for a higher IF frequency input, this input being approximately twice the frequency of the left hand input. The operation of our discriminator for this condition is the same as that just described, but the frequency doubling pulse generator output E has positive or upper level pulses of smaller duration than that for the lower frequency. This results in a lower average direct current level as illustrated by the dashed line. Thus, when the intermediate frequency changes from a relatively low frequency as shown at the times T0 through T6 to a higher frequency as shown beginning at the time T7, the average DC value at the output E decreases.

It will thus be seen that we have provided a new and improved discriminator which permits a relatively low intermediate frequency with frequency modulated (FM) signals to be demodulated with a relatively simple circuit, particularly in the low pass filter. By doubling the intermediate frequency, the low pass filter can be made to reject the intermediate frequencies and pass the audio frequencies even though the ratio of intermediate frequency to audio frequency bandwidth is relatively low. For example, an intermediate frequency of 7 Kilohertz, with its relatively good image frequency rejection possibilities, can be used for audio or voice transmissions having a bandwidth of 3 Kilohertz, and still be detected with a relatively simple low pass filter despite the low (2.3 to 1) IF to intelligence bandwidth ratio. By our doubling arrangement, the effective ratio is changed to 14 to 3, or 4.6 to 1, a condition that makes the design of the low pass filter much easier and more practical. While we have shown only one embodiment of our invention, persons skilled in the art will appreciate the modifications that may be made. For example, other types of circuits may be used in place of the amplitude limiter, the phase inverter, the frequency doubling pulse generator, and the low pass filter. Also, the input signals may be phase inverted first and then amplitude limited, although this would require two amplitude limiters instead of one as described. The frequence can be increased by other higher multiples such as four. This makes the filtering easier, but requires additional or more complex circuits. Therefore, while our invention has been described with reference to a particular embodiment, it is to be understood that modifications may be made without departing from the spirit of the invention or from the scope of the claims.

What we claim as new and desire to secure by Letters Patent of the United States is:

1. An improved discriminator for demodulating frequency modulated information on a relatively low frequency carrier signal comprising:
    a. an input for said low frequency carrier signal;
    b. an amplitude limiter connected to said input;
    c. a phase splitter connected to said amplitude limiter for producing two signals having a phase difference of substantially 180 degrees, and each having substantially the same frequency as said low frequency carrier signal;
    d. a frequency doubling pulse generator connected to said phase splitter for producing a sequence of pulses whose frequency is twice the frequency of said low frequency signal, and whose average direct current value varies inversely as a function of the frequency of said low frequency signal;
    e. and a low pass filter connected to said frequency doubling pulse generator for producing an audio output.

2. The improved discriminator of claim 1 wherein said phase splitter includes first and second capacitor charge and discharge circuits that are alternately operated, and first and second threshold circuits respectively connected to said first and second capacitor charge and discharge circuits for producing said two signals.

3. A frequency modulation radio receiver comprising:
    a. an input circuit for frequency modulated radio carrier signals;
    b. heterodyne means connected to said input circuit for converting said radio frequency carrier signals into intermediate frequency carrier signals;
    c. amplitude limiting means connected to said heterodyne means for limiting the amplitude of said intermediate frequency carrier signals;

d. phase splitter means connected to said amplitude limiting means for producing first and second signals at first and second outputs respectively, said first and second signals having substantially a 180 degree phase difference;

e. a capacitor charge and threshold circuit coupled to each of said first and second outputs respectively;

f. means for producing a pulse signal in response to either of said capacitors being charged to its respective threshold, and for producing no pulse signal in response to both of said capacitors being discharged below their respective thresholds;

g. and a low pass filter connected to said pulse producing means for producing an audible signal from said pulse signal.

4. The frequency modulated radio receiver of claim 3 wherein each of said charge circuits comprises a series current source for charging its respective capacitor, and comprises a parallel impedance for discharging its respective capacitor.

5. The frequency modulated radio receiver of claim 3 or claim 4 wherein said pulse signal has a frequency rate substantially twice the frequency of said amplitude limited intermediate frequency carrier signals.

* * * * *